United States Patent [19]

Rodot et al.

[11] 4,167,436

[45] Sep. 11, 1979

[54] PROCESS OF PREPARING CRYSTALS OF COMPOUNDS AND ALLOYS

[76] Inventors: Huguette Rodot nee Fumeron; Maurice Schneider, both of 1, Place Aristide Briand, 92-Bellevue, France; Arnost Hruby, Czechoslovak Academy of Science, Institute of Solid State Physics, Prague 6, Cuklrovarnicka 10, Czechoslovakia

[21] Appl. No.: 822,277

[22] Filed: Aug. 5, 1977
(Under 37 CFR 1.47)

Related U.S. Application Data

[63] Continuation of Ser. No. 527,688, Nov. 27, 1974, Pat. No. 4,040,894, which is a continuation of Ser. No. 232,240, Feb. 6, 1972, abandoned, which is a continuation of Ser. No. 841,667, Jun. 13, 1968, abandoned.

[30] Foreign Application Priority Data

Jun. 13, 1967 [FR] France ............................. 67.110074

[51] Int. Cl.² .............................................. B01J 17/04
[52] U.S. Cl. ..................................... 156/607; 156/621

[58] Field of Search ...................... 156/607, 621, 624; 23/295

[56] References Cited

U.S. PATENT DOCUMENTS

| 3,853,487 | 12/1974 | Melleman ............................ 156/621 |
| 4,040,894 | 8/1977 | Rodot et al. .......................... 156/609 |

*Primary Examiner*—Hiram H. Bernstein
*Attorney, Agent, or Firm*—Larson, Taylor and Hinds

[57] ABSTRACT

A liquid phase, which comprises either at least one of the constituents of the compound or alloy of which the crystal is to be prepared, or a foreign material, is fed continuously at its surface with the other constituent or constituents of this compound or alloy (or with all the constituents when the liquid phase comprises a foreign material). This liquid phase is subjected to two successive temperature gradients the first of which is slight and the second steep, so that the constituents are transported through the liquid phase and so that the crystallization of the compound or alloy takes place at the level of the second gradient. The liquid phase and the temperature gradients are displaced with respect to each other at a speed determined such that the composition of the liquid phase does not change and such that the crystallization always takes place at the same temperature.

3 Claims, 2 Drawing Figures

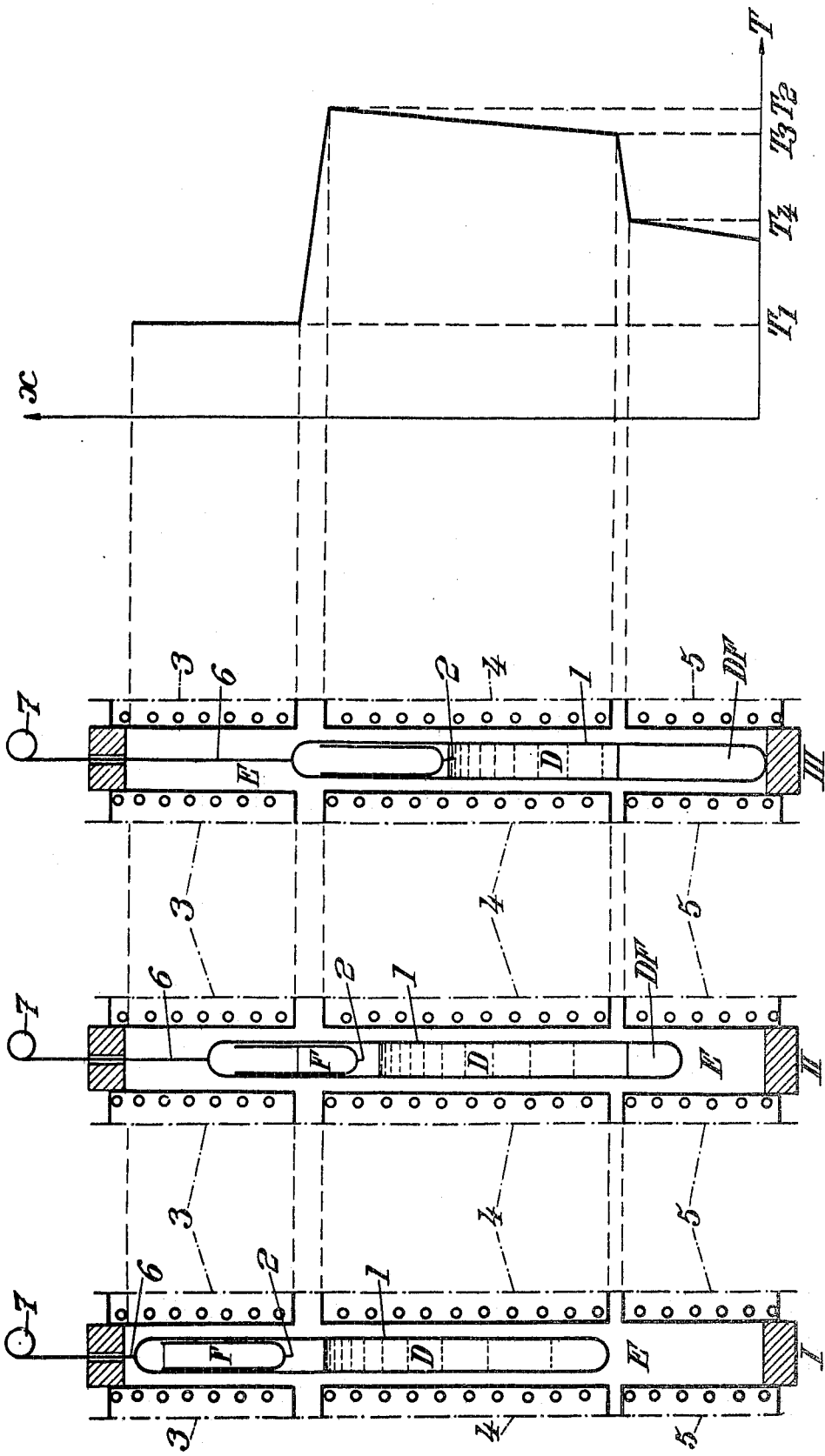

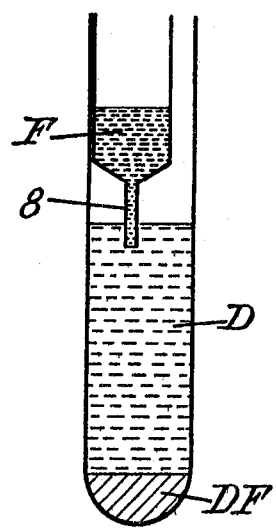

PROCESS OF PREPARING CRYSTALS OF COMPOUNDS AND ALLOYS

This is a continuation of U.S. patent application Ser. No. 527,688 filed Nov. 27, 1974 (now U.S. Pat. No. 4,040,894) which is a continuation of U.S. patent application Ser. No. 232,240 filed Feb. 6, 1972 (now abandoned) which is a continuation of U.S. patent application Ser. No. 841,667 filed June 13, 1968 (now abandoned).

The present invention relates to a process for preparing crystals of compounds or of alloys from a solution.

This process is characterized by the fact that a liquid phase, which comprises either at least one of the constituents of the compound or alloy of which it is desired to prepare a crystal, or a foreign material, is fed continuously at its surface with the other constituent or constituents of the compound of which it is desired to form the crystal (or with all the constituents of this crystal when the liquid phase comprises a foreign material), this liquid phase being subjected to an example of two successive temperature gradients the first of which is slight and the second of which is steep, in a manner such that the constituents are transported through the mass of the liquid phase and such that the crystallization of the compound or alloy sought can take place at the level of the second gradient, the liquid phase and the ensemble of temperature gradients being displaced one with respect to the other at a speed determined such that the composition of the liquid phase does not change and such that the crystallization always takes place at the same temperature.

The invention will be better understood from the following complementary description, as well as from the accompanying drawings FIG. 1 of which shows schematically, in three successive operating positions, one embodiment of a device for carrying out this process as in the embodiment illustrated in FIG. 2.

The following complementary description and the accompanying drawing are given merely by way of nonlimiting example.

There is a considerable need in industry for crystals of large size, in particular of semi-conductors, presenting very precise characteristics of homogeneity.

To prepare such crystals, for example crystals of a compound DF comprising two constituents D and F of which it is supposed that one, for example the constituent F, is volatile, whereas the constituent D can form a non-volatile liquid phase, the following process can be adopted, according to the invention.

At the interior of a common container there is disposed, on the one hand, the constituent D, and on the other hand, the constituent F, means being provided so that the constituent F can come into contact with the constituent D only in the vapour state.

In the drawing a practical embodiment of this container is represented, which has the form of a tube 1, for example of silica, at the interior of which is disposed, on the one hand, the constituent D, and on the other hand, the constituent F, this latter constituent being contained in an interior tube 2 fixed, for example by welding, against the interior wall of the tube 1, in the neighborhood of the upper end of the tube 1.

To feed, at its surface, the liquid phase formed by D, continuously with the constituent F, the part of the tube 1 which contains the constituent D is brought to a temperature higher than the fusion temperature of the constituent D, and the part of the same tube containing the interior tube 2 is brought to a temperature at which the compound F passes into the vapour state.

The vapour of F is thus constantly in contact with the surface of the constituent D and can, consequently, dissolve continuously in the constituent D, at the surface of the constituent D. The quantity dissolved depends on the two temperatures mentioned above.

The dissolved constituent F then reacts with the constituent D to form the compound DF, which dissolves in turn in the constituent D and diffuses towards the coldest point of the bath formed by the constituent D.

The liquid phase (or bath) formed by the constituent D is subjected to the ensemble of two successive temperature gradients whose characteristics are such that the crystallization of the compound DF can take place at the lower end of the tube 1.

To initiate the crystallization in this lower end of the tube 1, a seed can be placed there, for example.

To maintain constant the composition of the liquid phase and to arrange that the crystallization always takes place at the same temperature, the tube 1 and the ensemble of these two gradients are displaced, one with respect to the other, at a speed V, which is calculated in such a manner that the quantity of the compound DF which is formed at the liquid/vapour interface, and which redissolves in the bath formed by the constituent D, corresponds to the quantity of the compound DF which crystallizes at the level of the second gradient, the interface between the bath formed by D and the crystallized solid DF being maintained at the interior of the second gradient progressively as the crystallization takes place.

For the purpose of improving the crystallization interface, the second gradient has a temperature decrease equal in general to about 100° C. per centimeter of length of the tube. For the same purpose, the concentration of the compound to be crystallized is as small as possible in the liquid phase.

At the beginning of the process, the tube 1 is thus subjected to two juxtaposed temperature domains, namely:

a zone of constant temperature $T_1$ extending at least along a part of the zone of the tube 1 which contains the interior tube 2, this temperature $T_1$ fixing the vapour pressure of the constituent F prevailing at the interior of the tube 1 and, in particular, at the surface of the bath formed by the constituent D, a temperature gradient $T_2-T_3$ ($T_3 < T_2$ with $T_2$ and $T_3$ higher than $T_1$, $T_3$ being the liquidus temperature of the compound DF for the concentration of DF in D) of slight slope due to which there is established in the bath formed by the constituent D, a dynamic regime of transport of the compound DF which diffuses towards the end of the tube 1 which is located at the temperature $T_3$.

Once saturation is reached, the crystallization as well as the above-mentioned relative displacement between the tube and the gradient $T_2-T_3$ begin. From this moment, the tube is subjected at the level of its lower end to a third domain of temperatures, namely the steep gradient designated by $T_3-T_4$. The moment of saturation is determined by the calculations which will be explained in detail later on.

From a practical point of view, a device can be used such as that shown schematically in the drawing, in which three successive positions of the tube are shown, namely the positions I, II and III, which correspond respectively to the beginning of the process, to an intermediate position and to the end of the process. This device comprises three furnaces which are designated by 3, 4 and 5 and which establish respectively the three temperature domains mentioned above. These temperature domains are illustrated by the common graph provided at the right hand side of the drawing. As shown, the ensemble of the three furnaces delimits a space E at the interior of which is suspended the tube 1 by means of a thread 6 which connects it to the output shaft 7 of a device, not shown, capable of communicating to this tube any desired speed of descent, as low as this speed may be.

To determine the value of the speed of relative translation, it will be supposed that the transport of DF takes place by diffusion through the liquid bath formed by D, and the law of this diffusion will be applied, which is generally known by the name "Fick's Law", namely:

$$J = -K \frac{dV_F}{dx}$$

in which:

J represents the diffusion current, that is to say the weight of the constituent F crossing a unit surface per unit time, K represents the coefficient of diffusion of F in the constituent D (the characteristic value of coefficients of diffusion in liquids is of the order of $10^{-4}$ square centimeters/second).

$V_F$ represents the weight of F per unit volume of the solution and x represents the height of the liquid phase.

It can generally be considered that the gradient of concentration is linear, and consequently, the following simplified formula is obtained:

$$J = -K \left[ \frac{(V_F)_{II} - (V_F)_I}{x} \right]$$

in which:

$(V_F)_{II}$ represents the concentration of the constituent F in the solution at the liquid/vapour interface, $(V_F)_I$ represents the concentration of the constituent F in the solution at the crystallization interface.

Suppose that it is desired to prepare crystals of GaP, for example, by putting the process according to the invention into practice, gallium representing the constituent D and phosphorus the constituent F, the values of the temperatures to which the tube 1 is subjected can be the following:

$T_1 = 400°$ C.

$T_2 = 1000°$ C.

$T_3 = 800°$ C.

$T_4 = 500°$ C.

If the Ga-P phase diagram is consulted, it is found that the atomic concentrations of phosphorus in the solution at 800° and 1000° C. are respectively equal to $1.9 \times 10^{-3}$ and $1.5 \times 10^{-2}$.

Supposing that the solution is an ideal solution and taking the density of gallium and of phosphorus in the liquid form respectively equal to 6.1 grams/square centimeter and 1.7 grams/square centimeter, the following is obtained:

$(V_F)_{II} = 39.7 \times 10^{-3}$ g/cm$^3$ $(V_F)_I = 5.1 \times 10^{-3}$ g/cm$^3$ The value of K being taken, as indicated above, equal to $10^{-4}$ square centimeters/second, the following value for J is obtained, with x=4 centimeters:

$J = 8.7 \times 10^{-7}$ g/s

Knowing J, it is easy to determine the moment when saturation is reached, as well as the value of the speed of descent of the tube 1, so that the crystallization takes place at constant temperature.

Knowing that the lattice parameter of gallium phosphide is 5.43 A and that the lattice contains four atoms of phosphorus, it is found that the speed of descent should be of the order of a millimeter per 24 hours.

Experimental results have shown that this value is correct.

To prepare crystals of GaAs, very similar thermal conditions can be chosen, namely:

$T_1 = 400°$ C.

$T_2 = 1000°$ C.

$T_3 = 900°$ C.

The slope of the gradient $T_3 - T_4 = 80°$ C./centimeter.

The speed of descent is, this time, of the order of 2–3 millimeters per day.

In the foregoing, it has been supposed that the continuous feeding of the liquid bath formed by the constituent D took place from a vapour phase.

However this continuous feeding can also take place from a liquid or even solid phase. In that case, it is sufficient to put this liquid or solid phase in contact with the surface of the bath, which can be obtained, in the case of a liquid phase, for example by using a tube forming two compartments situated one as an extension of the other and interconnected by a constriction (for example capillary) at the level of which is located the bath/liquid phase feeding interface. In the case of a solid phase, a powder can be projected on the surface of the bath.

By providing an impurity, either in the bath, or in the phase from which the feeding of the bath takes place, a doping agent can be introduced into the crystal, with a perfectly constant concentration, as low as this concentration may be.

The process according to the invention has numerous advantages, in particular:

the advantage of effecting in a single operation the synthesis and the crystallization of a monocrystal, the advantage of permitting crystals of considerable length and diameter to be obtained from low concentration solutions, and by means of installations which are relatively small, the advantage of furnishing homogeneous crystals.

According to a variant, in the case of a container in the form of a tube, a constriction can be provided in the neighbourhood of the lower end of the tube, which has the consequence of causing the formation of a seed at the level of this constriction. This seed, which is formed freely in the midst of the liquid, leads to a better orientation of the crystal.

Although the present invention has been described with particular reference to specific embodiments, it is clear that many modifications and variations are possible without departing from the spirit or scope of the invention.

What we claim is:

1. A process for preparing large sized crystals of substances which are compounds or alloys of at least two constituents comprising (1) feeding continuously one of said at least two constituents in liquid or solid form to the surface of a liquid phase solution which contains the other of said at least two constituents to continuously dissolve said continuously fed constituent in said liquid phase solution so that all the constituents necessary to form said substance are then present in said solution; said process being carried out in a container containing said liquid phase solution in its one end and means above said liquid phase solution for introducing said continuously fed solid or liquid constituent; (2) simultaneously subjecting said liquid phase solution to a first slight temperature gradient zone in which zone the temperature is sufficiently high to maintain said liquid phase and in which the temperature gradient is sufficiently slight to ensure gradual and homogeneous diffusion of said substance formed at said surface through said solution, the temperature of the upper surface end of said zone being higher than the lower end thereof, allowing said liquid phase to reach saturation with said substance in the lower end only of said first temperature gradient zone; (3) maintaining a second steep temperature gradient zone located beneath said first temperature gradient zone in which the temperature is lower than in said temperature gradient zone; (4) crystallizing said substance at the level of said second gradient to form a solid-liquid interface; (5) ascertaining by the application of Fick's law when saturation of the liquid phase with said substance at said solid/liquid interface is reached; (6) when said saturation is reached, moving said liquid phase relative to said first and second temperature gradients while maintaining the solid liquid interface at the same temperature and same composition within the second gradient by controlling the rate of relative movement at a speed ascertained by Fick's law and while maintaining the continuous feeding of said solid or liquid constituent; thereby (7) continuously forming and growing crystals of said substance at said interface.

2. The process of claim 1 wherein the at least one constituent continually fed is a liquid introduced by means of a tube forming two compartments situated one as an extension of the other and interconnected by a constriction at the level of which is located the surface of said liquid phase solution.

3. The process of claim 1 wherein the constituent continually fed is in the form of a powder which is projected on the surface of said liquid phase solution.

* * * * *